(12) United States Patent
Radhakrishnan et al.

(10) Patent No.: US 12,074,514 B2
(45) Date of Patent: Aug. 27, 2024

(54) TWO STAGE MULTI-INPUT MULTI-OUTPUT REGULATOR

(71) Applicant: Intel Corporation, Santa Clara, CA (US)

(72) Inventors: Kaladhar Radhakrishnan, Chandler, AZ (US); Beomseok Choi, Chandler, AZ (US); Michael Hill, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 825 days.

(21) Appl. No.: 17/025,745

(22) Filed: Sep. 18, 2020

(65) Prior Publication Data
US 2022/0094256 A1    Mar. 24, 2022

(51) Int. Cl.
*H02M 3/07*     (2006.01)
*H01L 23/00*    (2006.01)
*H01L 25/065*   (2023.01)
*H02M 1/00*     (2007.01)

(52) U.S. Cl.
CPC .............. *H02M 3/07* (2013.01); *H01L 24/17* (2013.01); *H01L 25/0655* (2013.01); *H01L 2924/1427* (2013.01); *H02M 1/0045* (2021.05); *H02M 1/009* (2021.05)

(58) Field of Classification Search
CPC ....... H02M 3/07; H01L 24/17; H02L 25/0655
See application file for complete search history.

(56) References Cited

U.S. PATENT DOCUMENTS

| | | | |
|---|---|---|---|
| 2014/0084881 A1* | 3/2014 | Shih ........................ | G05F 1/56 323/269 |
| 2014/0344589 A1* | 11/2014 | Muthukaruppan ..... | H02M 3/07 323/280 |
| 2015/0022169 A1* | 1/2015 | Cannankurichi Vijaya Mohan .... | H02M 3/07 323/282 |
| 2016/0190113 A1* | 6/2016 | Sharan .................... | H01L 21/78 257/532 |
| 2017/0052552 A1* | 2/2017 | Mahmoudi ............. | G05F 1/575 |
| 2017/0093270 A1* | 3/2017 | Matthew .................. | G05F 1/32 |
| 2021/0075316 A1* | 3/2021 | Oshita .................... | H03K 5/249 |
| 2023/0139978 A1* | 5/2023 | Carobolante ............ | G06F 1/26 323/234 |

FOREIGN PATENT DOCUMENTS

| | | | | | |
|---|---|---|---|---|---|
| CN | 108322041 A | * | 7/2018 | ............... | G05F 1/56 |
| DE | 102015119892 A1 | * | 6/2016 | ............. | H01L 21/78 |

* cited by examiner

*Primary Examiner* — Sisay G Tiku
(74) *Attorney, Agent, or Firm* — Schwabe, Williamson & Wyatt, P.C.

(57) ABSTRACT

Embodiments disclosed herein include two stage voltage regulators for electronic systems. In an embodiment, a voltage regulator comprises a switched capacitor voltage regulator (SCVR). In an embodiment, the SCVR receives a first voltage as an input and outputs a plurality of SCVR output voltages. In an embodiment, the voltage regulator further comprises a low-dropout (LDO) regulator. In an embodiment, the LDO regulator receives one or more of the plurality of SCVR output voltages as LDO input voltages, and where the LDO regulator outputs a second voltage.

21 Claims, 8 Drawing Sheets

TWO STAGE MULTI-INPUT MULTI-OUTPUT REGULATOR

TECHNICAL FIELD

Embodiments of the present disclosure relate to semiconductor devices, and more particularly to a two stage voltage regulator comprising a switched capacitor voltage regulator SCVR and a low-dropout (LDO) regulator.

BACKGROUND

Today's microprocessors have a large range of voltage domains that need to be powered by a number of different voltage regulators (VRs). Powering all of these domains with VRs on the platform (e.g., motherboard) consumes a significant amount of platform real estate and leads to a high platform bill of materials (BOM). Integrating all of these domains on the package substrate using integrated voltage regulator (IVR) architectures, such as fully integrated voltage regulator (FIVR) architectures, can have an adverse effect on battery life due to inefficiencies at light loads. The poor efficiency is due to fixed losses that are experienced whether operating at a high load or a light load. As a result, current client microprocessors have the domains powered by motherboard voltage regulators (MBVRs) despite the high cost and poor real estate utilization.

EMBODIMENTS OF THE PRESENT DISCLOSURE

Figure 1A:
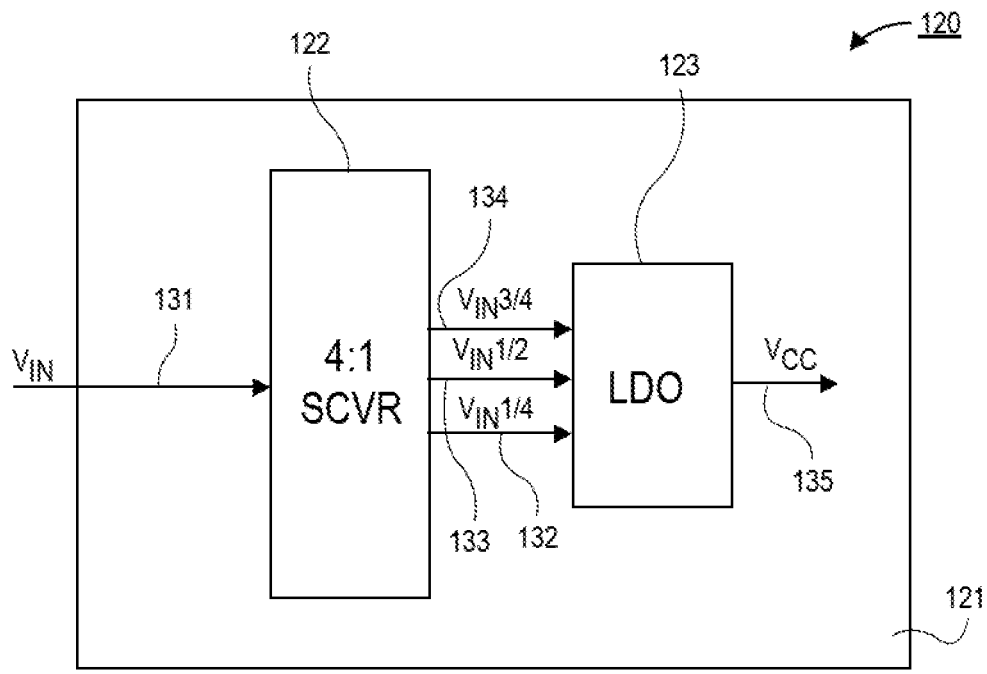
FIG. 1A is a schematic illustration of a two stage voltage regulator with a 4:1 switched capacitor voltage regulator (SCVR) and a low-dropout (LDO) regulator, in accordance with an embodiment.

Described herein are two stage voltage regulators comprising a switched capacitor voltage regulator SCVR and a low-dropout (LDO) regulator, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, motherboard voltage regulators (MBVRs) are relatively expensive and result in suboptimal motherboard real estate utilization. However, integrated voltage regulator solutions, such as fully integrated voltage regulator (FIVR) architectures, suffer from inefficiencies at light loads. Accordingly, such architectures may not be suitable for providing long battery life in client microprocessors. Accordingly, embodiments described herein include a two stage voltage regulator.

In two stage voltage regulators described herein, a first stage may include a switched capacitor voltage regulator (SCVR), and a second stage may include a low-dropout (LDO) regulator. The combination of the SCVR and LDO regulator allows for a high efficiency regulator that has the needed flexibility to provide voltages for various domains.

To provide context, the use of an SCVR only solution would generally not be practical. An SCVR solution is only capable of providing fixed ratio conversions from $V_{IN}$ to $V_{OUT}$, and cannot generate a $V_{OUT}$ voltage that is insensitive to variations in $V_{IN}$. However, SCVR solutions are attractive because they can achieve much higher efficiencies than a buck regulator. Additionally, SCVR architectures do not require the use of inductors and/or transformers. Instead, capacitors are all that are required. This simplifies the fabrication and assembly costs of the SCVR compared to buck regulator architectures, such as fully integrated voltage regulator (FIVR) architectures.

A single input LDO regulator would also suffer from decreased efficiency. This is because the efficiency of the LDO regulator is dependent on the ratio of $V_{IN}$ to $V_{OUT}$. Efficiencies are improved when $V_{IN}$ is closer to $V_{OUT}$. As such, using the same input voltage to multiple LDOs with vastly different output voltages results in significant decreases in efficiency.

However, when combining an SCVR with an LDO regulator, improved efficiencies and flexibilities are provided. In embodiments disclosed herein, multiple inputs to the LDO regulator (that are derived from the SCVR) can be multiplexed depending on the desired output voltage. That is, the SCVR can be used to provide fixed ratio conversion to a plurality of different $V_{OUT}$ levels, and the plurality of $V_{OUT}$ levels can then be used as inputs for an LDO regulator. The LDO regulator is able to select the desired $V_{OUT}$ level from the SCVR that most closely matches the desired $V_{OUT}$ from the LDO regulator. Additionally, the ability to select different inputs into the LDO can be leveraged to provide improved transient response. For example, a higher input voltage can be selected in order to drive more current through the LDO regulator. Such transient response accommodation can be made without any latency or commands to the SCVR stage, since a switch to the desired input voltage is all that needs to be done by the LDO when a transient state is initiated.

In a particular embodiment, for illustrative purposes, the SCVR may be a 4:1 SCVR with a 3.0V input voltage ($V_{IN}$). The SCVR is then able to derive output voltages ($V_{OUT}$) of 0.75V (i.e., one-fourth $V_{IN}$), 1.5V (i.e., one-half $V_{IN}$), and 2.25V (i.e., three-fourths $V_{IN}$). These output voltages can then be fed as inputs to the LDO regulators down-stream. If the LDO regulator's desired output voltage is 2.0V, then the 2.25V $V_{OUT}$ can be used as the input to the LDO regulator. If the LDO regulator desires an output voltage of 1.2V, then the 1.5V $V_{OUT}$ can be used as the input to the LDO regulator. Similarly, if the LDO regulator desires an output voltage of 0.6V, then the 0.75V $V_{OUT}$ can be used as the input to the LDO regulator.

Those skilled in the art will readily be able to identify when a product utilizes one or more aspects of embodiments described herein. For example, a high voltage regulator that does not include the use of inductors is likely using an SCVR based scheme. As such, when the voltage regulator utilizes capacitors instead of inductors, some aspects of embodiments disclosed herein may be being used. Additionally, the two stage voltage regulator architecture may be identified by probing the different nets to identify if multiple outputs from the SCVR are used as multiple inputs to the second stage regulator. Additionally, a non-linear control scheme may be identifiable to indicate that switching between inputs for the second stage is used to improve the transient response.

Referring now to FIG. 1A, a schematic illustration of a two stage voltage regulator 120 is shown, in accordance with an embodiment. In an embodiment, the two stage voltage regulator 120 comprises an SCVR 122 as the first stage and an LDO regulator 123 as the second stage. As illustrated, the SCVR 122 and the LDO regulator 123 may be provided as part of a single substrate 121. For example, the substrate 121 may be a silicon substrate or any other semiconductor die. However, it is to be appreciated that the SCVR 122 and the LDO regulator 123 may also be provided on different substrates, as will be described in greater detail below. In an embodiment, the SCVR 122 can be used to provide fixed ratio conversion to a plurality of different $V_{OUT}$ voltages 132-134, and the plurality of $V_{OUT}$ voltages 132-134 can then be used as inputs for an LDO regulator 123. The LDO regulator 123 is able to select the desired $V_{OUT}$ voltage 132-134 from the SCVR 122 that most closely matches the desired $V_{CC}$ voltage 135 from the LDO regulator 123.

In an embodiment, the SCVR 122 is a voltage regulator that utilizes capacitors instead of inductors or transformers. The ability to provide the voltage conversion with only capacitors allows for simplified manufacture of the SCVR 122 compared to voltage regulators that rely on inductors and/or transformers. For example, the capacitors may be integrated onto the substrate 121, without the need for providing passives in the package substrate or on the motherboard. For example, the capacitors may be implemented as deep trench capacitors in the substrate 121. However, it is to be appreciated that embodiments are not limited to capacitors that are integrated on the substrate 121. For example, the capacitors may optionally be included as discrete capacitors that are provided on the package substrate.

In an embodiment, the SCVR 122 receives a $V_{IN}$ voltage 131 as an input. The $V_{IN}$ voltage 131 may be provided from a buck regulator on a motherboard (not shown). For example, the $V_{IN}$ voltage 131 may be 3.0V. In an embodiment, the SCVR 122 may output a plurality of SCVR output voltages (e.g., output voltages 132, 133, and 134). The SCVR 122 may provide a fixed ratio conversion of the $V_{IN}$ voltage 131 to the SCVR output voltages 132-134. In the embodiment shown in FIG. 1A, the SCVR 122 may be a 4:1 SCVR 122. As such, the SCVR 122 may output three output voltages. A first output voltage 132 may be one-fourth the $V_{IN}$ voltage 131, a second output voltage 133 may be one-half the $V_{IN}$ voltage 131, and a third output voltage 134 may be three-fourths the $V_{IN}$ voltage 131.

In an embodiment, the plurality of SCVR output voltages 132-134 may be provided as an input voltage to the LDO regulator 123. The LDO regulator 123 is configured to use one of the SCVR output voltage 132-134 and convert to a desired $V_{CC}$ voltage 135. As those skilled in the art will appreciate, the efficiency of the LDO regulator 123 is improved when the input voltage to the LDO regulator 123 (i.e., the SCVR output voltages 132-134) closely matches the $V_{CC}$ voltage 135. That is, moving the ratio of the input voltage to the $V_{CC}$ voltage closer to 1.0 improves the efficiency of the LDO regulator 123. Accordingly, the LDO regulator 123 may select the SCVR output voltage 132-134 that most closely matches the desired $V_{CC}$ voltage 135.

In a particular embodiment, the SCVR input voltage $V_{IN}$ 131 may be 3.0V. The SCVR 122 is then able to derive output voltages (132-134) of 0.75V (i.e., one-fourth $V_{IN}$), 1.5V (i.e., one-half $V_{IN}$), and 2.25V (i.e., three-fourths $V_{IN}$). These output voltages can then be fed as inputs to the LDO regulator 123 down-stream. If the LDO regulator's 123 desired $V_{CC}$ voltage 135 is 2.0V, then the 2.25V output voltage 134 can be used as the input to the LDO regulator 123. If the LDO regulator 123 desires a $V_{CC}$ voltage 135 of 1.2V, then the 1.5V output voltage 133 can be used as the input to the LDO regulator 123. Similarly, if the LDO regulator 123 desires a $V_{CC}$ voltage of 0.6V, then the 0.75V output voltage 132 can be used as the input to the LDO regulator 123.

Figure 1B:
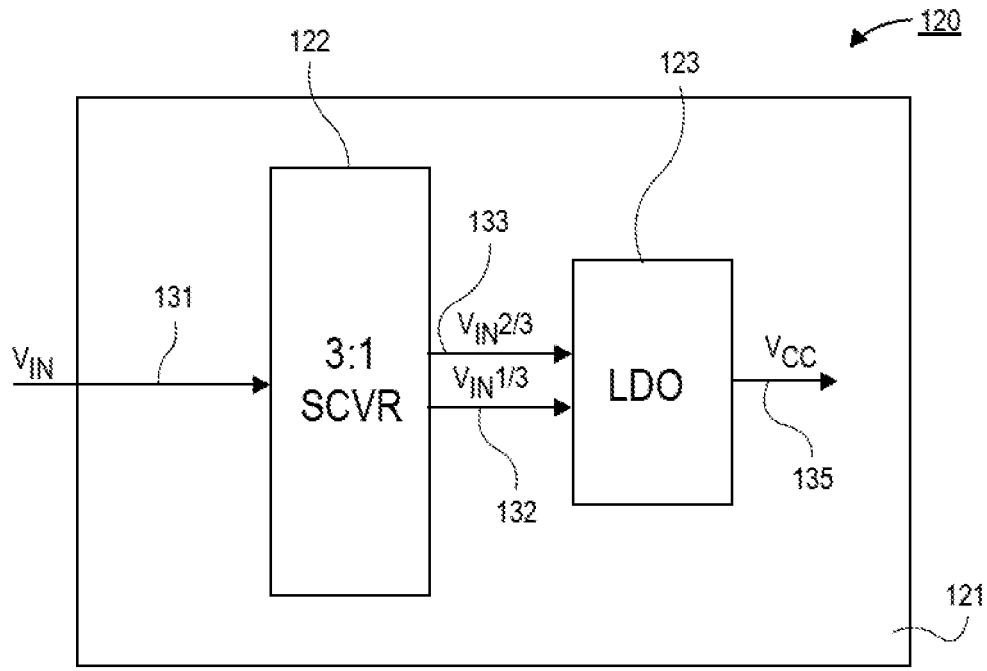
FIG. 1B is a schematic illustration of a two stage voltage regulator with a 3:1 SCVR and a LDO regulator, in accordance with an embodiment.

Referring now to FIG. 1B, a schematic view illustration of a two stage voltage regulator 120 is shown, in accordance with an additional embodiment. The two stage voltage regulator 120 in FIG. 1B may be substantially similar to the two stage voltage regulator 120 in FIG. 1A, with the exception that the SCVR 122 is a 3:1 SCVR 122 instead of a 4:1 SCVR 122. As such, the fixed voltage ratios 133 and 132 are two-thirds the input voltage 131 and one-third the input voltage 131, respectively.

While a 4:1 SCVR 122 and a 3:1 SCVR 122 are shown for illustrative purposes, it is to be appreciated that embodiments are not limited to such fixed ratio implementations. Embodiments disclosed herein may utilize any ratio SCVR 122. For example, higher ratio SCVRs 122 may provide more output voltages to the LDO regulator 123 and provide additional voltage options that can be used to further improve efficiencies.

Figure 2A:
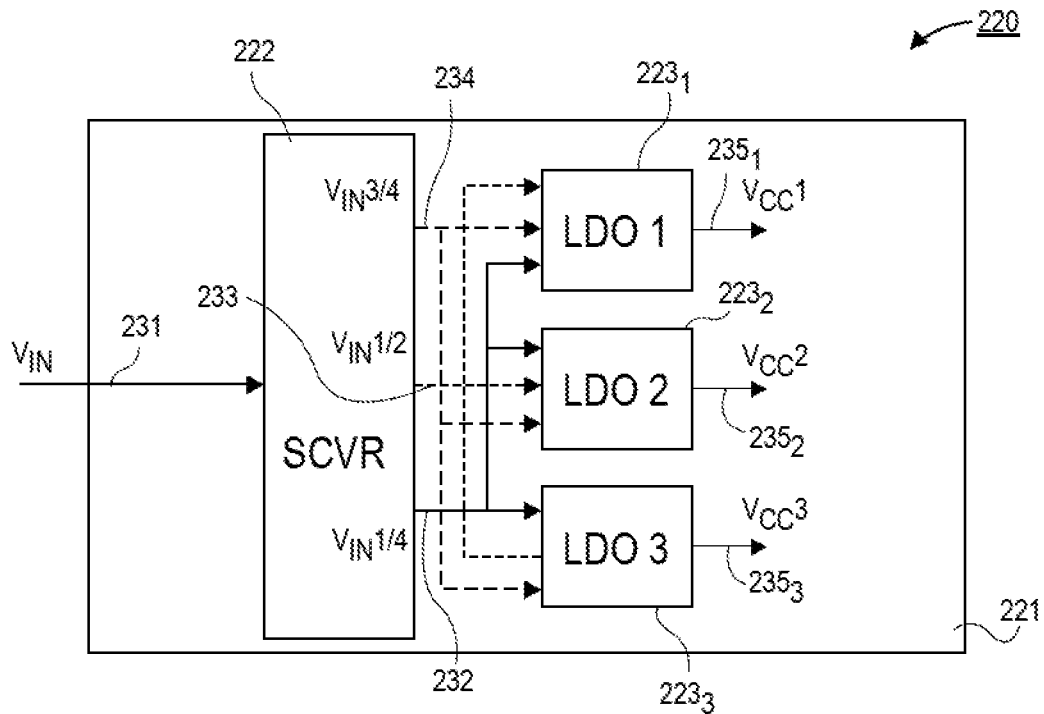
FIG. 2A is a schematic illustration of a two stage voltage regulator with an SCVR and a plurality of LDO regulators, where each LDO regulator is connected to all of the SCVR outputs, in accordance with an embodiment.

Referring now to FIG. 2A, a schematic illustration of a two stage voltage regulator 220 is shown, in accordance with an embodiment. In an embodiment, the two stage regulator 220 may comprise an SCVR 222 and a plurality of LDO regulators 223. For example, three LDO regulators $223_{1-3}$ are provided. The plurality of different LDO regulators 223 may allow for a plurality of different voltage domains to be serviced by the two stage voltage regulator 220. Furthermore, while three LDO regulators $223_{1-3}$ are shown, it is to be appreciated that any number of LDO regulators 223 may be provided in the two stage voltage regulator 220.

In an embodiment, the SCVR 222 and the LDO regulators $223_{1-3}$ are implemented on a single substrate 221. For example, the substrate 221 may be a silicon substrate or any other semiconductor die. However, it is to be appreciated that the SCVR 222 and the LDO regulators $223_{1-3}$ may also be provided on different substrates, as will be described in greater detail below.

In an embodiment, the SCVR 222 may receive an input voltage $V_{IN}$ 231 from an external source. For example, the input voltage $V_{IN}$ 231 may be provided by a voltage regulator on the motherboard (not shown). The SCVR 222 may provide fixed ratio conversions of the input voltage $V_{IN}$ 231 to a plurality of SCVR output voltages 232-234. In the illustrated embodiment, the SCVR 222 is a 4:1 ratio SCVR 222 and provides three SCVR output voltages 232-234. However, it is to be appreciated that the SCVR 222 may include any ratio and provide any number of SCVR output voltages 232-234. In the particular embodiment illustrated in FIG. 2A, the SCVR output voltage 232 is one-fourth the input voltage $V_{IN}$ 231, the SCVR output voltage 233 is one-half the input voltage $V_{IN}$ 231, and the SCVR output voltage 234 is three-fourths the input voltage $V_{IN}$ 231.

In an embodiment, the plurality of SCVR output voltages 232-234 may be provided to each of the LDO regulators $223_{1-3}$. That is, each LDO regulator $223_{1-3}$ may receive as inputs three different SCVR output voltages 232-234. Accordingly, each LDO regulator $223_{1-3}$ has the flexibility to select the desired input voltage that provides the efficiency conversion to a desired $V_{CC}$ voltage $235_{1-3}$. In some embodiments, each LDO regulator $223_{1-3}$ may select different SCVR output voltages 232-234. In other embodiments, two or more of the LDO regulators $223_{1-3}$ may select the same SCVR output voltage 232-234.

Figure 2B:
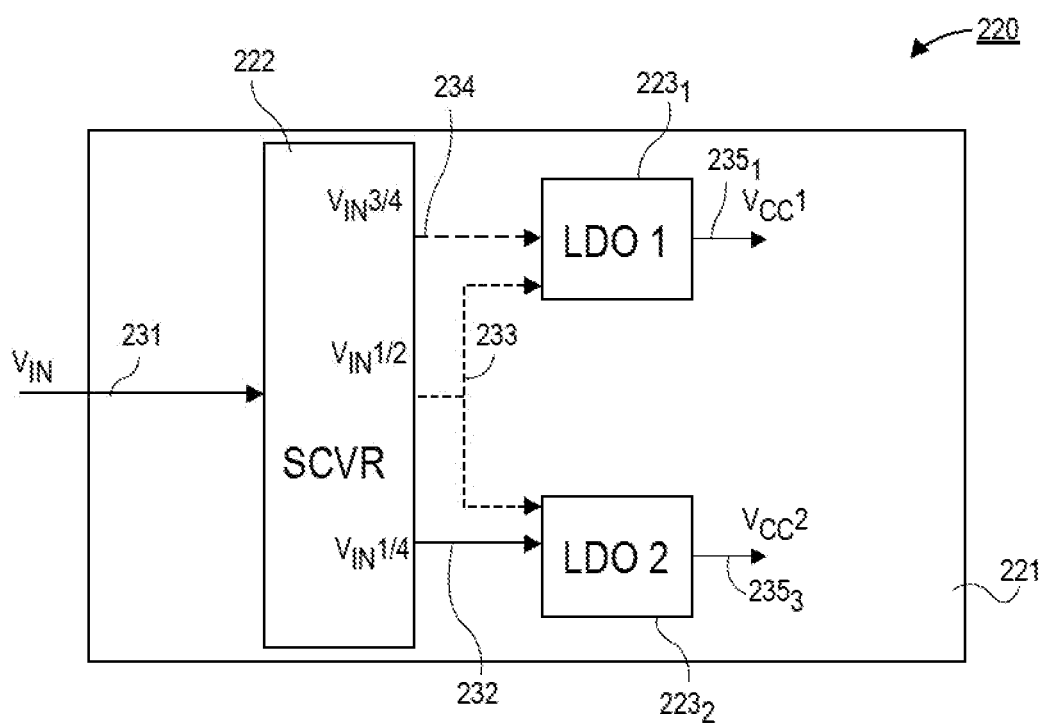
FIG. 2B is a schematic illustration of a two stage voltage regulator with an SCVR and a pair of LDO regulators, where each LDO regulator is connected to two of the three SCVR outputs, in accordance with an embodiment.

Referring now to FIG. 2B, a schematic illustration of a two stage voltage regulator 220 is shown, in accordance with an embodiment. In an embodiment, the two stage voltage regulator 220 includes an SCVR 222 and a plurality of LDO regulators $223_1$ and $223_2$. The SCVR 222 in FIG. 2B is substantially similar to the SCVR 222 in FIG. 2A. That is, the SCVR 222 receives, as an input, a $V_{IN}$ voltage 231 and outputs a plurality of SCVR output voltages 232-234.

FIG. 2B differs from FIG. 2A in that not all of the SCVR output voltages 232-234 are supplied to each of the LDO regulators $223_1$ and $223_2$. For example, a first SCVR output voltage 232 and a second SCVR output voltage 233 are supplied to the second LDO regulator $223_2$, and the second SCVR output voltage 233 and the third SCVR output voltage 234 are supplied to the first LDO regulator $223_1$. That is, only the second SCVR output voltage 233 is supplied to more than one of the LDO regulators $223_1$ and $223_2$. Such an embodiment may be beneficial when the necessary output voltage $V_{CC}1$ $235_1$ is generally expected to be higher than the necessary output voltage $V_{CC}2$ $235_2$. For example, the first LDO regulator $223_1$ may not be expected to utilize the first SCVR output voltage 232, and the second LDO regulator $223_2$ may not be expected to utilize the third SCVR output voltage 234. As such, it may not be necessary to route all SCVR output voltages 232-234 to each of the LDO regulators $223_1$ and $223_2$.

Figure 3A:
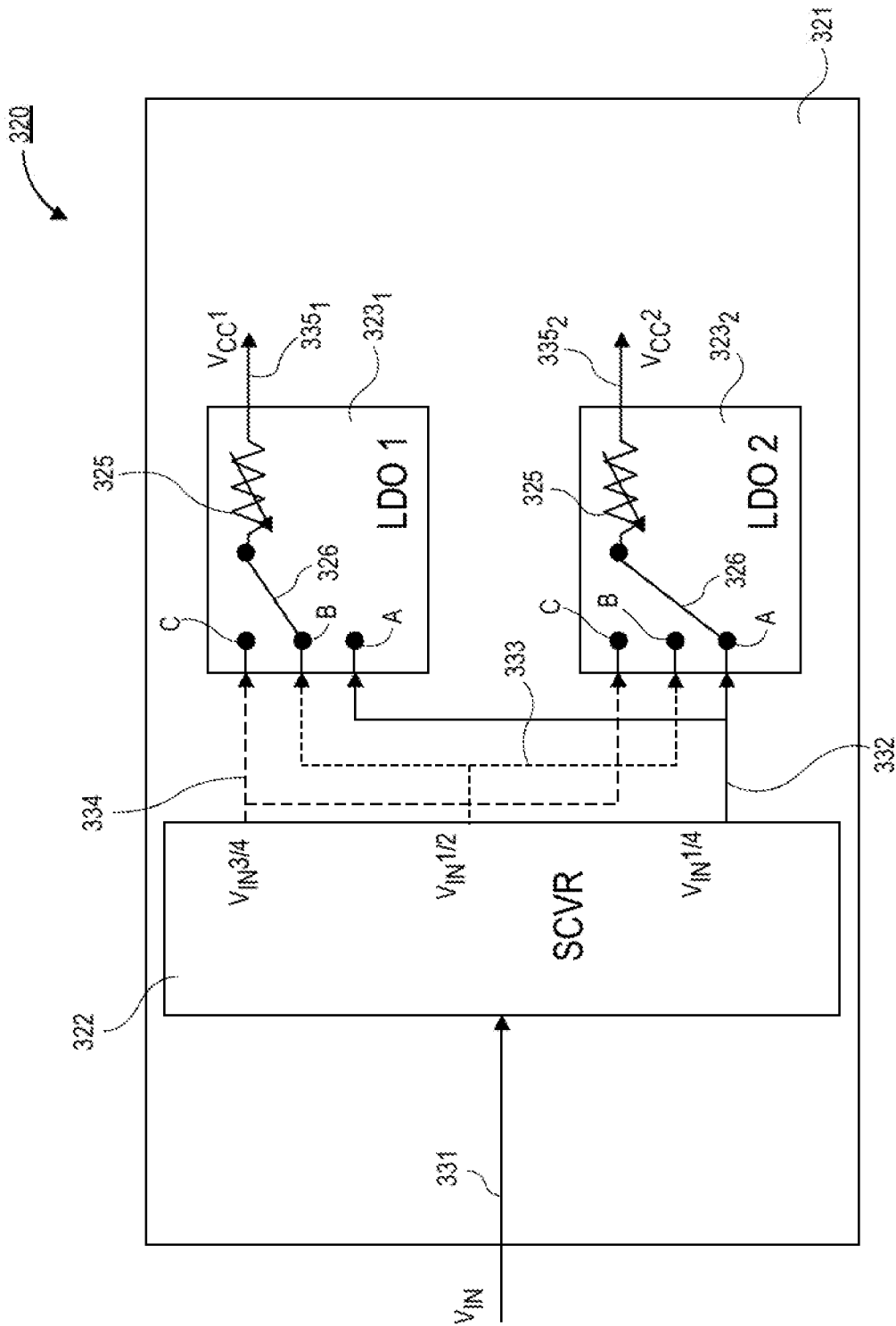
FIG. 3A is a schematic illustration of a two stage voltage regulator in a steady state power state, in accordance with an embodiment.
Figure 3B:
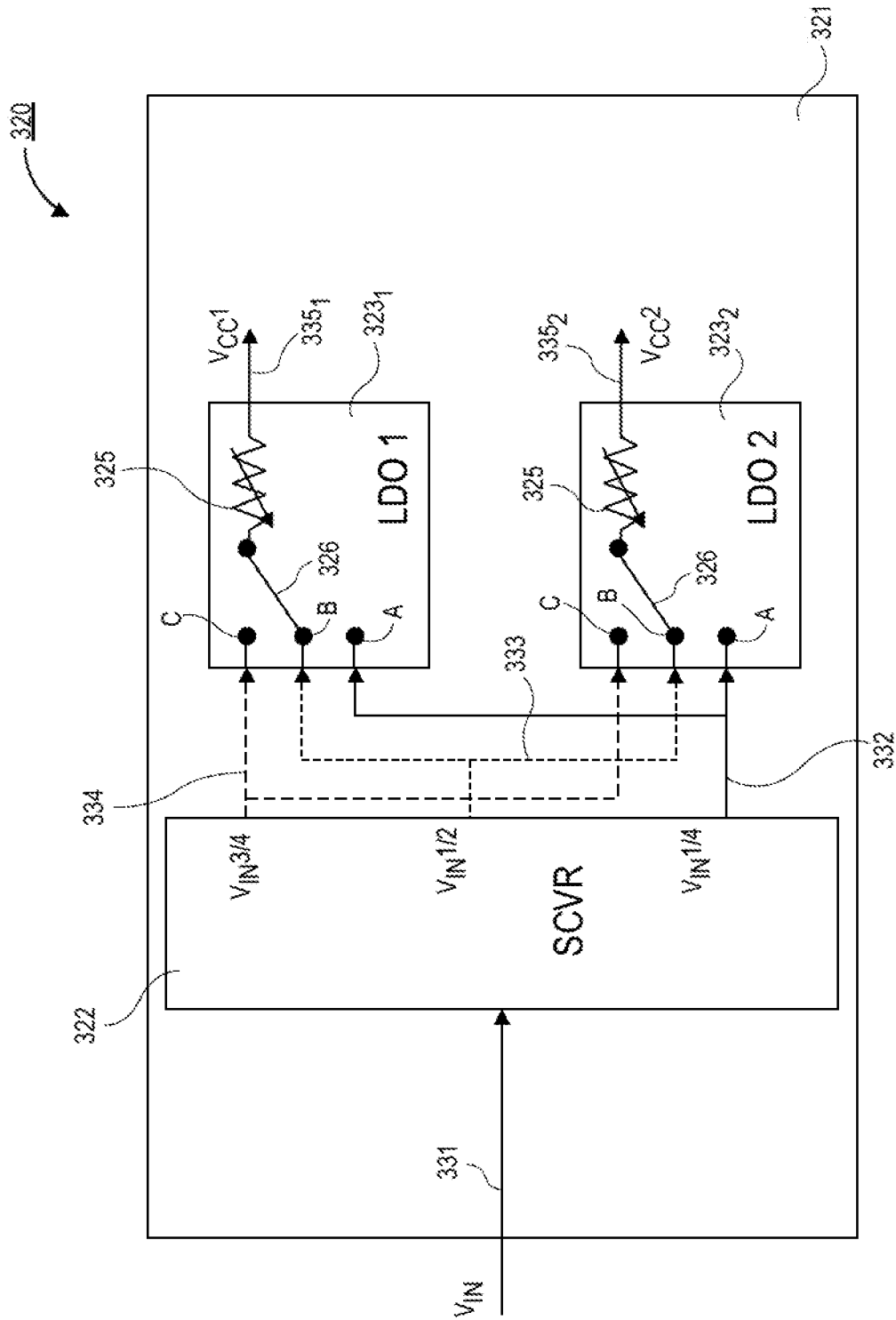
FIG. 3B is a schematic illustration of a two stage voltage regulator where one of the LDO regulators is in a transient power state, in accordance with an embodiment.

Referring now to FIGS. 3A and 3B, a series of schematic illustrations of a two stage voltage regulator 320 is shown, in accordance with an embodiment. FIG. 3A is an illustration of the voltage regulator 320 in a steady state, and FIG. 3B is an illustration of the voltage regulator 320 when the second LDO $323_2$ is put in a transient state. As will be appreciated by those skilled in the art, the ability to switch between input voltages allows for increased current to be supplied through the second LDO $323_2$ in order to satisfy the power requirements of a transient (i.e., higher power) state of the load (not shown) connected to the second LDO $323_2$.

Referring now to FIG. 3A, a schematic illustration of the two stage voltage regulator 320 in a steady state is shown, in accordance with an embodiment. In an embodiment, the voltage regulator 320 comprises an SCVR 322 and a plurality of LDO regulators $323_1$ and $323_2$. The SCVR 322 and the plurality of LDO regulators $323_1$ and $323_2$ may be provided on a single substrate 321, such as a silicon substrate or the like. In other embodiments, the SCVR 322 and the plurality of LDO regulators $323_1$ and $323_2$ may be on different substrates, as will be described in greater detail below.

The SCVR 322 may receive, as an input, an input voltage $V_{IN}$ 331. The SCVR 322 may output a plurality of SCVR output voltages 332-334. In an embodiment, one or more of the SCVR output voltages 332-334 are provided to each of the LDO regulators $323_1$ and $323_2$. In the particular embodiment shown in FIG. 3A, all three of the SCVR output voltages 332-334 are supplied to both LDO regulators $323_1$ and $323_2$. In an embodiment, each of the SCVR output voltages 332-334 are connected to nodes A-C on each LDO regulator $323_1$ and $323_2$.

In an embodiment, a variable resistor 325 may be connected to one of nodes A-C by a switch 326. The switch 326 may selectively connect to either of the nodes A-C to provide a desired input voltage. For example, the variable resistor 325 in the first LDO regulator $323_1$ is connected to node B by the switch 326, and the variable resistor 325 in the second LDO regulator $323_2$ is connected to node A by the switch 326. That is, the variable resistor 325 in the first LDO regulator $323_1$ is connected to the one-half $V_{IN}$ voltage 333, and the second LDO regulator $323_2$ is connected to the one-fourth $V_{IN}$ voltage 332.

Referring now to FIG. 3B, a schematic illustration of the two stage voltage regulator 320 during a transient state is shown, in accordance with an embodiment. As used herein a "transient state" may refer to a change in the power consumption of a load that is serviced by the two stage voltage regulator 320. For example, a transient state may refer to the change from a low power consumption state of the load to a high power consumption state of the load.

The voltage regulator 320 may be substantially similar to the voltage regulator 320 in FIG. 3A, with the exception that the switch 326 in the second LDO regulator $323_2$ is now connected to node B. As such, additional current can be passed through the variable resistor 325. Such transient response accommodation can be made without any latency or commands to the SCVR 322 since the SCVR 322 is already generating the necessary SCVR 322 output voltage 333. To accommodate the transient state, all that is required is to change the state of the switch 326 so that it connects to the node A, B. or C that includes the desired input voltage to the LDO regulator.

Figure 4A:
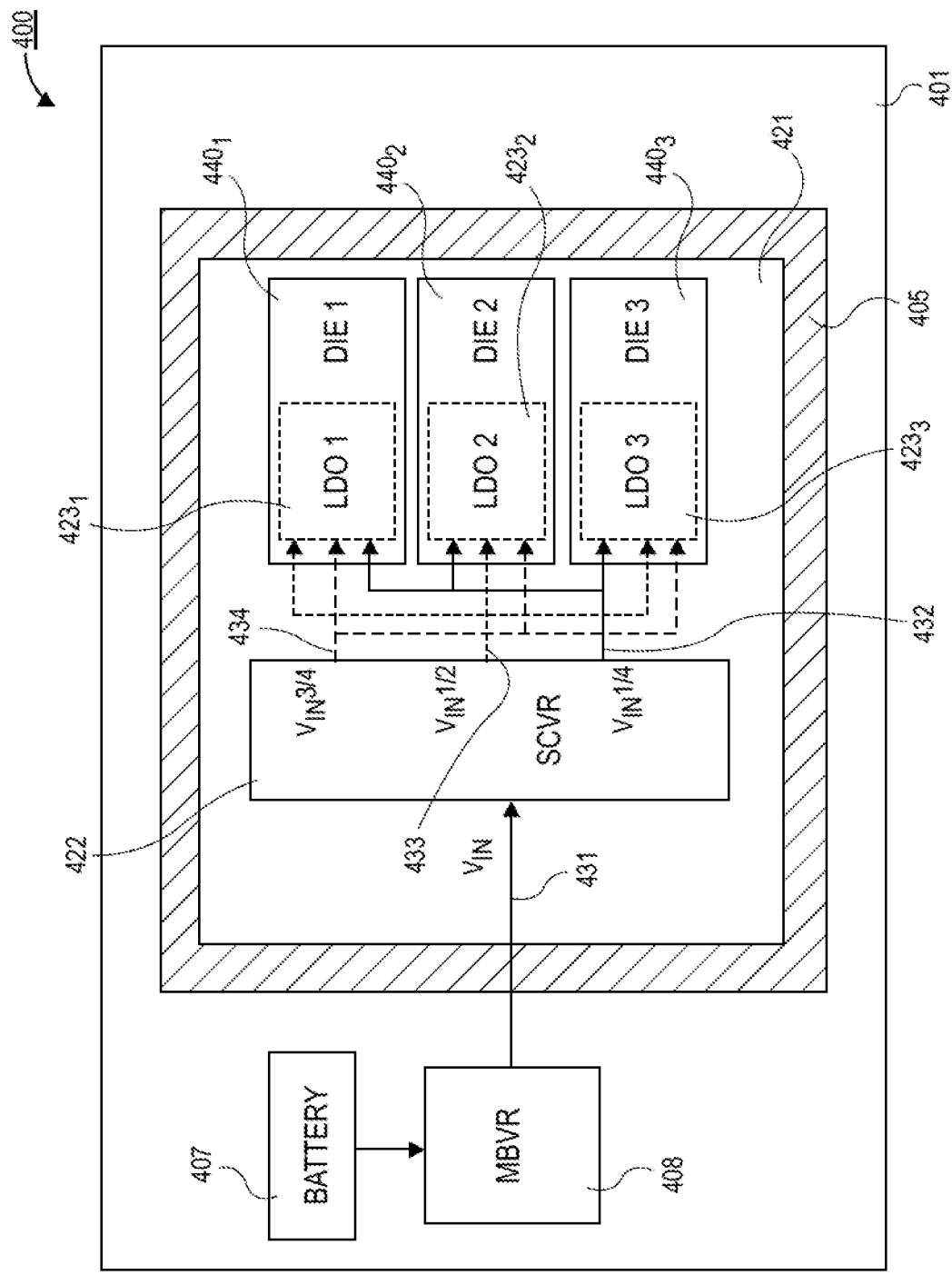
FIG. 4A is a plan view illustration of an electronic system that includes a two stage voltage regulator that services a plurality of dies, in accordance with an embodiment.

Referring now to FIG. 4A, a plan view illustration of an electronic system 400 that comprises a two stage voltage regulator is shown, in accordance with an embodiment. In an embodiment, the electronic system 400 may comprise a board 401 (e.g., a motherboard or other printed circuit board (PCB)) and a package substrate 405 over the board 401. In an embodiment, a base die 421 is provided over the package substrate 405. In an embodiment, a two stage voltage regulator comprising an SCVR 422 and a plurality of LDO regulators $423_{1-3}$ is provided as part of the base die 421. However, it is to be appreciated that the SCVR 422 and the plurality of LDO regulators $423_{1-3}$ may be implemented on different die substrates.

In an embodiment, a plurality of second dies $440_{1-3}$ are provided above the base die 421. Particularly, each of the second dies $440_{1-3}$ may be located above one of the LDO regulators $423_{1-3}$. The LDO regulators $423_{1-3}$ are shown with dashed lines to indicate that they are below the second dies $440_{1-3}$. In an embodiment, the plurality of second dies $440_{1-3}$ may be any suitable die necessary for the electronic system 400. By way of example, and not by limitation, the second dies $440_{1-3}$ may include one or more of a compute die, a system on chip (SoC) die, and a graphics die. While three second dies $440_{1-3}$ are shown, it is to be appreciated that any number of second dies 440 may be included in the electronic system 400. The inclusion of various types of second dies 440 may result in the need for many different voltage domains. The two stage voltage regulator may be suitable for providing the necessary voltages for the different voltage domains.

In an embodiment, a battery 407 may be provided on the board 401. The voltage from the battery 407 may be stepped down by a motherboard voltage regulator (MBVR) 408. For example, the MBVR 408 may be a buck converter. In a particular embodiment, the MBVR 408 steps down a 10.8V input to a 3.0V output. The output of the MBVR 408 is utilized as an input voltage $V_{IN}$ 431 for the SCVR 422. The MBVR 408 may be connected to the SCVR 422 through the package substrate 405.

In an embodiment, the SCVR 422 provides a plurality of SCVR voltage outputs 432-434. For example, a 4:1 ratio SCVR 422 is shown in FIG. 4A. However, it is to be appreciated that the SCVR 422 may have any ratio to provide a desired number of SCVR voltage outputs 432-434. In an embodiment, the SCVR voltage outputs 432-434 are provided to each of the LDO regulators $423_{1-3}$. However, it is to be appreciated that each LDO regulator $423_{1-3}$ may receive one or more of the SCVR voltage outputs 432-434. In an embodiment, the output voltage of each LDO regulator $423_{1-3}$ may be supplied to a different one of the plurality of second dies $440_{1-3}$. Particularly, a load in each of the plurality of second dies $440_{1-3}$ may be supplied a voltage from the LDO regulators $423_{1-3}$.

Figure 4B:
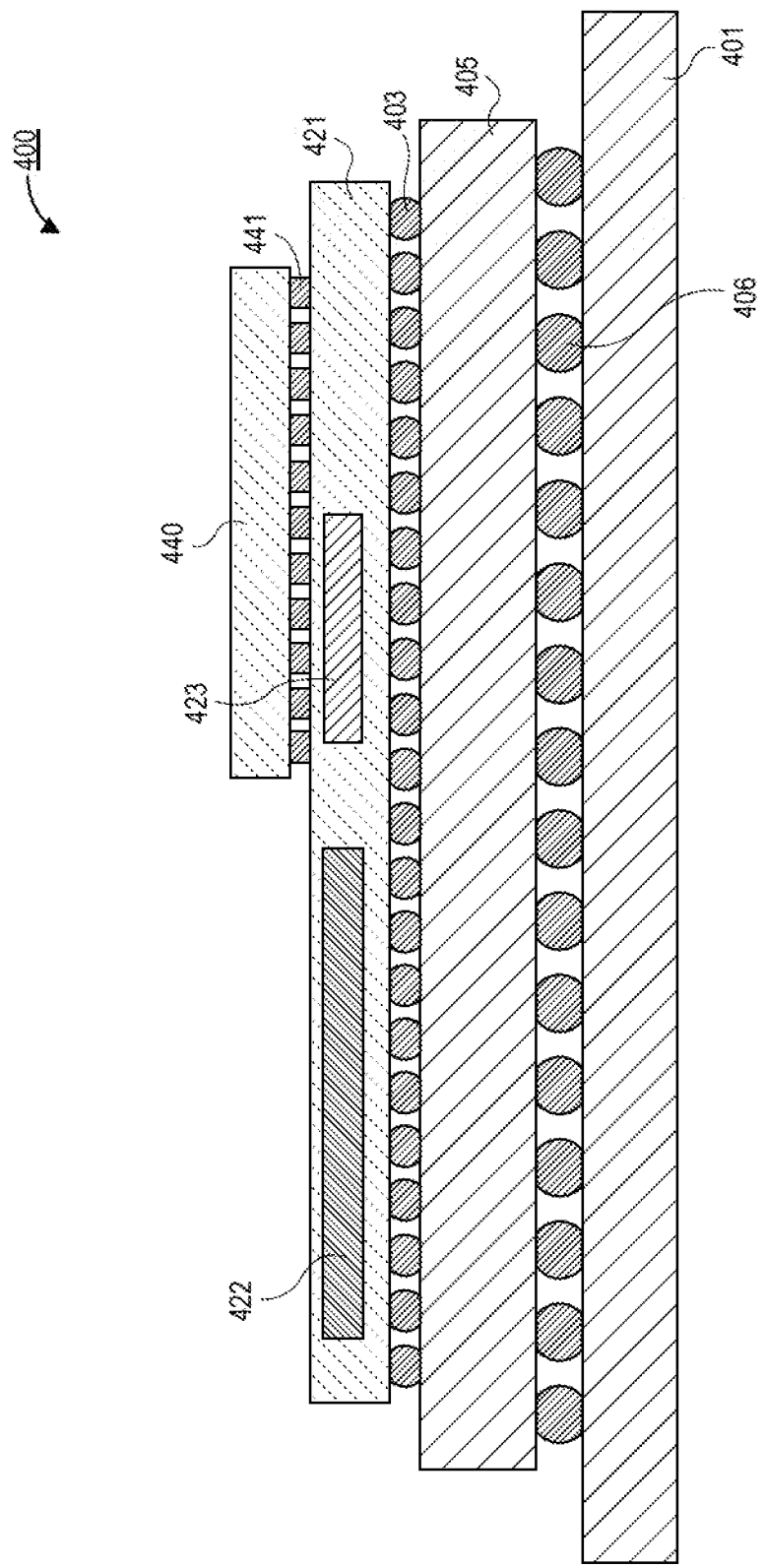
FIG. 4B is a cross-sectional illustration of the electronic system in FIG. 4A, in accordance with an embodiment.

Referring now to FIG. 4B, a cross-sectional illustration of the electronic system 400 in FIG. 4A is shown, in accordance with an embodiment. As shown, the package substrate 405 is coupled to the board 401 by interconnects 406. The interconnects 406 are shown as solder balls, but it is to be appreciated that any interconnect architecture (e.g., sockets, etc.) may be used to connect the package substrate 405 to the board.

In an embodiment the base die 421 is attached to the package substrate 405 by interconnects 403. The interconnects 403 may be any suitable first level interconnect (FLI) or mid-level interconnect (MLI). As shown, the SCVR 422 and the LDO regulator 423 are implemented within the base die 421. In an embodiment, a second die 440 is attached to the base die 421 by interconnects 441, such as microbumps or the like. In an embodiment, the second die 440 is provided at least partially over the LDO regulator 423. That is, the LDO regulator 423 is at least partially within a footprint of the second die 440.

In the Figures described above, the SCVR and the LDO regulators are described as being implemented on the same die substrate. However, it is to be appreciated that the SCVR and the LDO regulators may be implemented on different die substrates. Examples of such architectures are provided in FIGS. 5A and 5B.

Figure 5A:
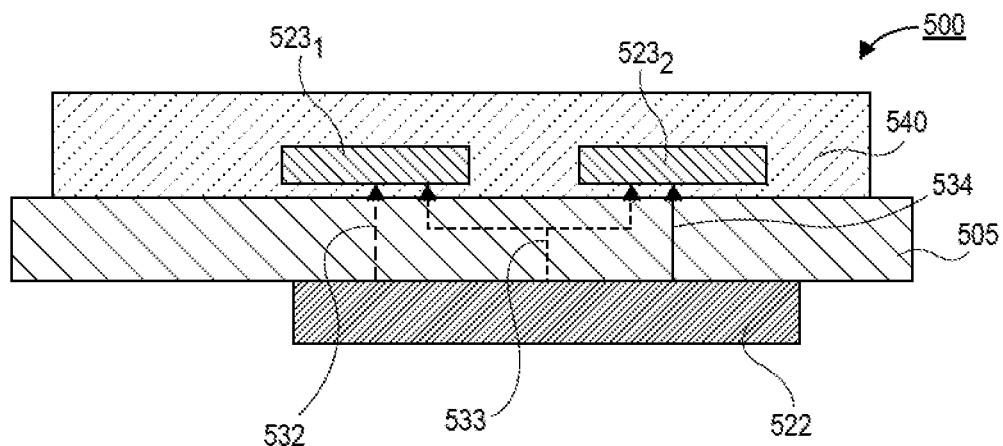
FIG. 5A is a cross-sectional illustration of an electronic system with a two stage voltage regulator with the SCVR below a package substrate and a pair of LDO regulators integrated into a die over the package substrate, in accordance with an embodiment.

Referring now to FIG. 5A, a cross-sectional illustration of an electronic system 500 is shown, in accordance with an embodiment. In FIG. 5A, the SCVR 522 is a discrete die that is provided on a bottom surface of the package substrate 505. In an embodiment, the LDO regulators $523_1$ and $523_2$ are provided on a die 540 that is attached to the top surface of the package substrate 505. The die 540 may be any suitable die, such as, but not limited to, a base die, a compute die, an SoC, and a graphics die. SCVR output voltages 532-534 are routed from the SCVR 522 through the package substrate 505 to the LDO regulators $523_1$ and $523_2$.

Figure 5B:
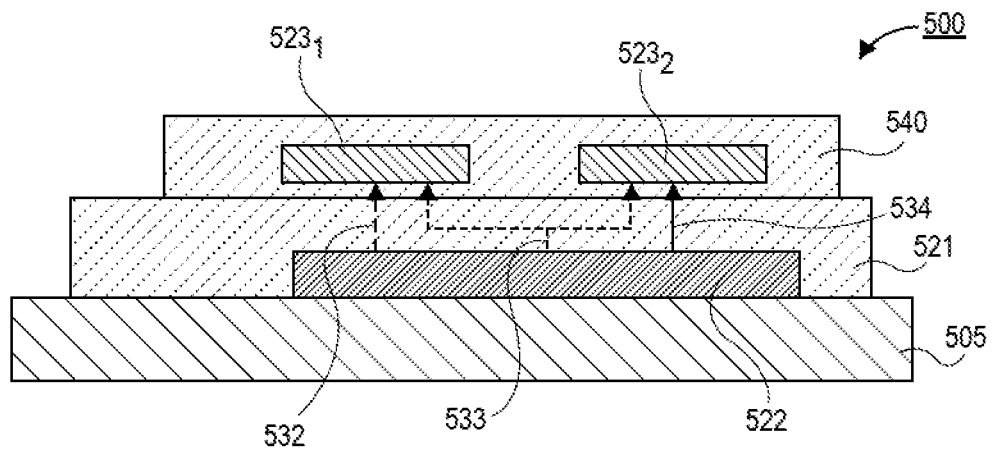
FIG. 5B is a cross-sectional illustration of an electronic system with a two stage voltage regulator with the SCVR in a first die over the package substrate and a pair of LDO regulators integrated into a second die over the first die, in accordance with an embodiment.

Referring now to FIG. 5B, a cross-sectional illustration of an electronic system 500 is shown, in accordance with an additional embodiment. As shown in FIG. 5B, a base die 521 is provided over a package substrate 505. The SCVR 522 may be implemented in the base die 521. A second die 540 is provided over the base die 521. The second die 540 may be any suitable die, such as, but not limited to, a compute die, an SoC, and a graphics die. In an embodiment, the LDO regulators $523_1$ and $523_2$ may be implemented as part of the second die 540. SCVR output voltages 532-534 may be routed from the SCVR 522 to the LDO regulators $523_1$ and $523_2$ through the base die 521 and the second die 540.

Figure 6:
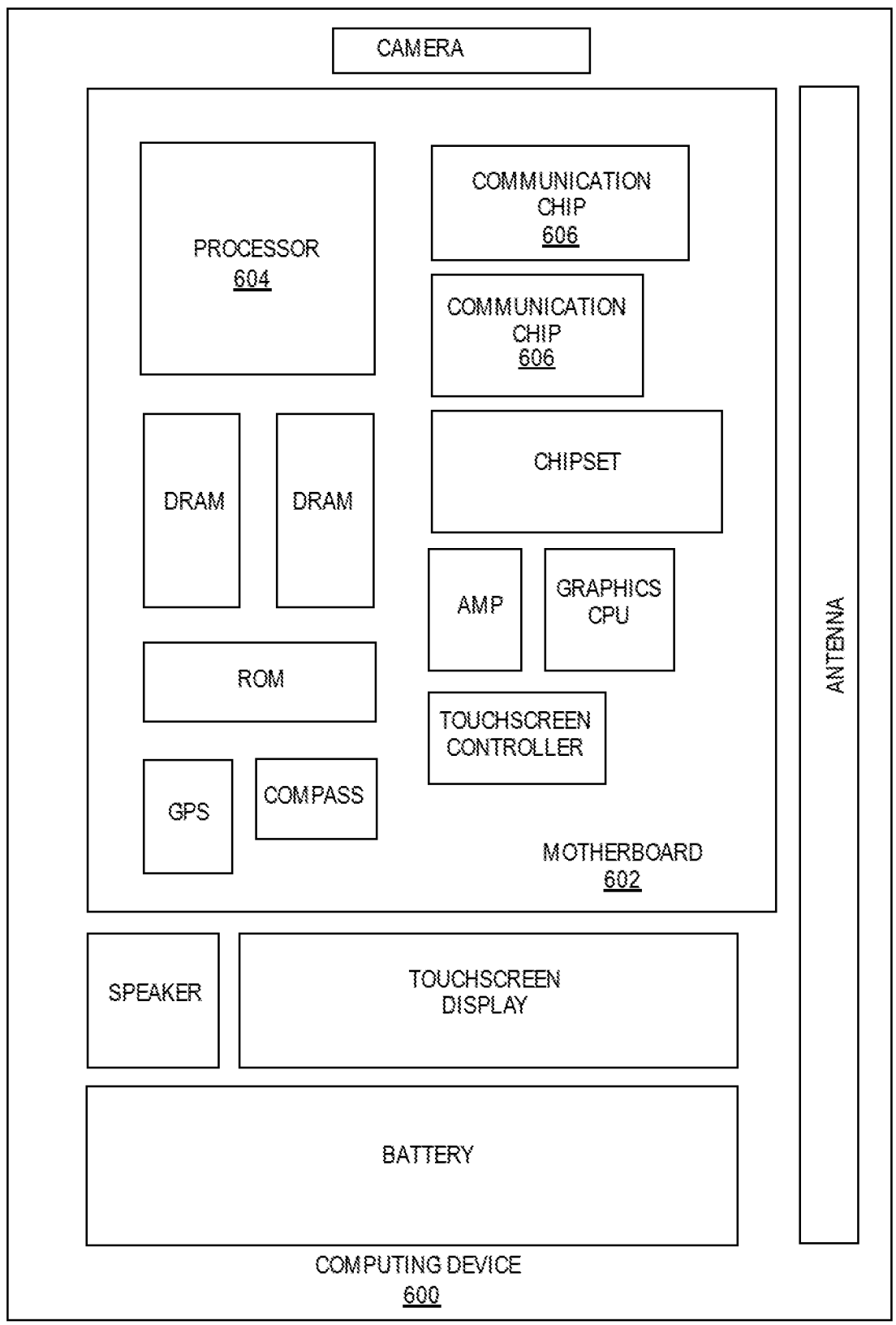
FIG. 6 is a schematic of a computing device built in accordance with an embodiment.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations, the integrated circuit die of the processor may be coupled to an electronic package that comprises a two stage voltage regulator that comprises an SCVR and one or more LDO regulators, in accordance with embodiments described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip may be coupled to an electronic package that comprises a two stage voltage regulator that comprises an SCVR and one or more LDO regulators, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a voltage regulator, comprising: a switched capacitor voltage regulator (SCVR), wherein the SCVR receives a first voltage as an input and outputs a plurality of SCVR output voltages; a low-dropout (LDO) regulator, wherein the LDO regulator receives one or more of the plurality of SCVR output voltages as LDO input voltages, and wherein the LDO regulator outputs a second voltage.

Example 2: the voltage regulator of Example 1, wherein the SCVR is a 4:1 SCVR.

Example 3: the voltage regulator of Example 2, wherein the plurality of SCVR output voltages, comprise: a third voltage, wherein the third voltage is three-fourths the first voltage; a fourth voltage, wherein the fourth voltage is one-half the first voltage; and a fifth voltage, wherein the fifth voltage is one-fourth the first voltage.

Example 4: the voltage regulator of Example 1, wherein the SCVR is a 3:1 SCVR.

Example 5: the voltage regulator of Example 4, wherein the plurality of SCVR output voltages comprise: a third voltage, wherein the third voltage is two-thirds the first voltage; and a fourth voltage, wherein the fourth voltage is one-third the first voltage.

Example 6: the voltage regulator of Examples 1-5, wherein the SCVR and the LDO regulator are fabricated on a single substrate.

Example 7: the voltage regulator of Examples 1-5, wherein the SCVR is fabricated on a first substrate, and wherein the LDO regulator is fabricated on a second substrate.

Example 8: the voltage regulator of Examples 1-7, wherein the LDO regulator is a first LDO regulator of a plurality of LDO regulators, and wherein individual ones of the plurality of LDO regulators are electrically coupled to the SCVR.

Example 9: the voltage regulator of Example 8, wherein individual ones of the plurality LDO regulators receive one or more of the plurality of SCVR output voltages as LDO input sources.

Example 10: the voltage regulator of Example 8, wherein the plurality of LDO regulators comprises the first LDO regulator and a second LDO regulator, and wherein the plurality of SCVR output voltages comprises: a third voltage; a fourth voltage; and a fifth voltage.

Example 11: the voltage regulator of Example 10, wherein the first LDO regulator receives the third voltage and the fourth voltage as LDO input sources, and wherein the second LDO regulator receives the fourth voltage and the fifth voltage as LDO input sources.

Example 12: the voltage regulator of Examples 1-11, wherein the LDO regulator comprises: a variable resistor, and wherein an input to the variable resistor can be switched between the one or more of the plurality of SCVR output voltages.

Example 13: an electronic system, comprising: a package substrate; a first die coupled to the package substrate; a second die coupled to the first die; and a two-stage voltage regulator for providing a load voltage to a load on the second die, wherein the two-stage voltage regulator comprises: a switched capacitor voltage regulator (SCVR), wherein the SCVR receives a first voltage as an input and outputs a plurality of SCVR output voltages; a low-dropout (LDO) regulator, wherein the LDO regulator receives one or more of the plurality of SCVR output voltages as LDO input voltages, and wherein the LDO regulator outputs the load voltage.

Example 14: the electronic system of Example 13, wherein the SCVR and the LDO regulator are provided on the first die.

Example 15: the electronic system of Example 13, wherein the SCVR is provided on the first die, and wherein the LDO regulator is provided on the second die.

Example 16: the electronic system of Examples 13-15, wherein the LDO regulator is a first LDO regulator of a plurality of LDO regulators, wherein individual ones of the plurality of LDO regulators are electrically coupled to the SCVR.

Example 17: the electronic system of Example 16, further comprising: a third die, wherein the first LDO regulator provides the load voltage to the load on the second die, and wherein a second LDO regulator provides a second load voltage to a second load on the third die.

Example 18: the electronic system of Example 17, wherein the plurality of SCVR output voltages comprises: a second voltage; a third voltage; and a fourth voltage.

Example 19: the electronic system of Example 18, wherein the first LDO regulator receives the second voltage and the third voltage as LDO input sources, and wherein the second LDO regulator receives the third voltage and the fourth voltage as LDO input sources.

Example 20: the electronic system of Examples 13-19, wherein the SCVR is a 4:1 SCVR.

Example 21: the electronic system of Examples 13-19, wherein the SCVR is a 3:1 SCVR.

Example 22: an electronic system, comprising: a board; a battery coupled to the board; a first voltage regulator on the board, wherein the first voltage regulator converts a battery voltage of the battery to an input voltage; a package substrate coupled to the board; a first die on the package substrate, wherein the first die comprises a second voltage regulator, wherein the second voltage regulator comprises: a switched capacitor voltage regulator (SCVR), wherein the SCVR receives the input voltage and outputs a plurality of SCVR output voltages; a low-dropout (LDO) regulator, wherein the LDO regulator receives one or more of the plurality of SCVR output voltages as LDO input voltages, and wherein the LDO regulator outputs a load voltage; and a second die coupled to the first die, wherein the second die comprises a load, wherein the load voltage is supplied to the load.

Example 23: the electronic system of Example 22, wherein the first voltage regulator is a buck converter.

Example 24: the electronic system of Example 22 or Example 23, wherein the SCVR is a 4:1 SCVR ora 3:1 SCVR.

Example 25: the electronic system of Examples 22-24, wherein the LDO regulator comprises: a variable resistor, and wherein an input to the variable resistor can be switched between the one or more of the plurality of SCVR output voltages.

What is claimed is:

1. A voltage regulator, comprising: a switched capacitor voltage regulator (SCVR), wherein the SCVR receives a first voltage as an input and outputs a plurality of SCVR output voltages; a low-dropout (LDO) regulator, wherein the LDO regulator receives one or more of the plurality of SCVR output voltages as LDO input voltages, and wherein the LDO regulator outputs a second voltage; wherein the SCVR has a 4:1 SCVR mode, wherein the plurality of SCVR output voltages, comprise: a third voltage, wherein the third voltage is three-fourths the first voltage; a fourth voltage, wherein the fourth voltage is one-half the first voltage; and a fifth voltage, wherein the fifth voltage is one-fourth the first voltage.

2. The voltage regulator of claim 1, wherein the SCVR and the LDO regulator are fabricated on a single substrate.

3. The voltage regulator of claim 1, wherein the SCVR is fabricated on a first substrate, and wherein the LDO regulator is fabricated on a second substrate.

4. The voltage regulator of claim 1, wherein the LDO regulator is a first LDO regulator of a plurality of LDO regulators, and wherein individual ones of the plurality of LDO regulators are electrically coupled to the SCVR.

5. The voltage regulator of claim 4, wherein individual ones of the plurality LDO regulators receive one or more of the plurality of SCVR output voltages as LDO input sources.

6. The voltage regulator of claim 4, wherein the plurality of LDO regulators comprises the first LDO regulator and a second LDO regulator, and wherein the plurality of SCVR output voltages comprises: the third voltage; the fourth voltage; and the fifth voltage.

7. The voltage regulator of claim 6, wherein the first LDO regulator receives the third voltage and the fourth voltage as LDO input sources, and wherein the second LDO regulator receives the fourth voltage and the fifth voltage as the LDO input sources.

8. The voltage regulator of claim 1, wherein the LDO regulator comprises:
a variable resistor, and wherein an input to the variable resistor can be switched between the one or more of the plurality of SCVR output voltages.

9. An electronic system, comprising:
a package substrate;
a first die coupled to the package substrate;
a second die coupled to the first die; and
a two-stage voltage regulator for providing a load voltage to a load on the second die, wherein the two-stage voltage regulator comprises:
a switched capacitor voltage regulator (SCVR), wherein the SCVR receives a first voltage as an input and outputs a plurality of SCVR output voltages;
a low-dropout (LDO) regulator, wherein the LDO regulator receives one or more of the plurality of SCVR output voltages as LDO input voltages, and
wherein the LDO regulator outputs the load voltage; and
a third die, wherein the first LDO regulator provides the load voltage to the load on the second die, and wherein a second LDO regulator provides a second load voltage to a second load on the third die.

10. The electronic system of claim 9, wherein the SCVR and the LDO regulator are provided on the first die.

11. The electronic system of claim 9, wherein the SCVR is provided on the first die, and wherein the LDO regulator is provided on the second die.

12. The electronic system of claim 9, wherein the LDO regulator is a first LDO regulator of a plurality of LDO regulators, wherein individual ones of the plurality of LDO regulators are electrically coupled to the SCVR.

13. The electronic system of claim 9, wherein the plurality of SCVR output voltages comprises: a second voltage; a third voltage; and a fourth voltage.

14. The electronic system of claim 13, wherein the first LDO regulator receives the second voltage and the third voltage as LDO input sources, and wherein the second LDO regulator receives the third voltage and the fourth voltage as the LDO input sources.

15. The electronic system of claim 9, wherein the SCVR has a 4:1 SCVR mode.

16. The electronic system of claim 9, wherein the SCVR has a 3:1 SCVR mode.

17. An electronic system, comprising: a board; a battery coupled to the board; a first voltage regulator on the board, wherein the first voltage regulator converts a battery voltage of the battery to an input voltage; a package substrate coupled to the board; a first die on the package substrate, wherein the first die comprises a second voltage regulator, wherein the second voltage regulator comprises: a switched capacitor voltage regulator (SCVR), wherein the SCVR receives a first voltage as the input voltage and outputs a plurality of SCVR output voltages; a low-dropout (LDO) regulator, wherein the LDO regulator receives one or more of the plurality of SCVR output voltages as LDO input voltages, and wherein the LDO regulator outputs a load voltage; and a second die coupled to the first die, wherein the second die comprises a load, wherein the load voltage is supplied to the load; wherein the SCVR has a 4:1 SCVR mode, wherein the plurality of SCVR output voltages, comprise: a third voltage, wherein the third voltage is three-fourths the first voltage; a fourth voltage, wherein the fourth voltage is one-half the first voltage; and a fifth voltage, wherein the fifth voltage is one-fourth the first voltage.

18. The electronic system of claim 17, wherein the first voltage regulator is a buck converter.

19. The electronic system of claim 17, wherein the SCVR has a 4:1 SCVR mode or has a 3:1 SCVR mode.

20. The electronic system of claim 17, wherein the LDO regulator comprises:
   a variable resistor, and wherein an input to the variable resistor can be switched between the one or more of the plurality of SCVR output voltages.

21. A voltage regulator, comprising: a switched capacitor voltage regulator (SCVR), wherein the SCVR receives a first voltage as an input and outputs a plurality of SCVR output voltages; a low-dropout (LDO) regulator, wherein the LDO regulator receives one or more of the plurality of SCVR output voltages as LDO input voltages, and wherein the LDO regulator outputs a second voltage; wherein the SCVR has a 3:1 SCVR mode; wherein the plurality of SCVR output voltages comprise: a third voltage, wherein the third voltage is two-thirds the first voltage; and a fourth voltage, wherein the fourth voltage is one-third the first voltage.

\* \* \* \* \*